United States Patent
Yun et al.

(10) Patent No.: US 9,978,988 B2
(45) Date of Patent: May 22, 2018

(54) ORGANIC LIGHT-EMITTING DISPLAY APPARATUS

(71) Applicant: SAMSUNG DISPLAY CO., LTD., Yongin-si, Gyeonggi-do (KR)

(72) Inventors: Wonmin Yun, Yongin-si (KR); Eungseok Park, Yongin-si (KR); Byoungduk Lee, Yongin-si (KR); Yunah Chung, Yongin-si (KR); Yoonhyeung Cho, Yongin-si (KR); Yongchan Ju, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days. days.

(21) Appl. No.: 15/205,668

(22) Filed: Jul. 8, 2016

(65) Prior Publication Data
US 2017/0125731 A1    May 4, 2017

(30) Foreign Application Priority Data
Nov. 3, 2015    (KR) ........................ 10-2015-0153804

(51) Int. Cl.
*H01L 51/52*    (2006.01)
*H01L 51/56*    (2006.01)

(52) U.S. Cl.
CPC ...... *H01L 51/5253* (2013.01); *H01L 51/5259* (2013.01); *H01L 51/56* (2013.01)

(58) Field of Classification Search
CPC . H01L 51/52; H01L 51/5253; H01L 51/5259; H01L 51/56
See application file for complete search history.

(56) References Cited

U.S. PATENT DOCUMENTS

| | | |
|---|---|---|
| 2011/0127570 A1 | 6/2011 | Um et al. |
| 2011/0156578 A1 | 6/2011 | Jeon et al. |
| 2012/0187399 A1* | 7/2012 | Fukuda ............ H01L 29/78603 257/43 |
| 2014/0361263 A1 | 12/2014 | Kim et al. |
| 2015/0108442 A1 | 4/2015 | Kim et al. |
| 2015/0144909 A1* | 5/2015 | Byun ................. H01L 51/5253 257/40 |
| 2016/0027851 A1* | 1/2016 | Yanagisawa ........ H01L 27/3244 257/43 |
| 2016/0155979 A1* | 6/2016 | Yim .................... H01L 51/5281 257/40 |

FOREIGN PATENT DOCUMENTS

| | | |
|---|---|---|
| KR | 1020110062156 A | 6/2011 |
| KR | 1020110077940 A | 7/2011 |
| KR | 1020140143635 A | 12/2014 |
| KR | 1020150044723 A | 4/2015 |
| KR | 1020150074826 A | 7/2015 |

* cited by examiner

*Primary Examiner* — Phuc Dang
(74) *Attorney, Agent, or Firm* — Cantor Colburn LLP (57) ABSTRACT

An organic light-emitting display apparatus includes a substrate, a pixel electrode on the substrate, a capping layer on the pixel electrode, a second organic layer on the capping layer, a first organic layer between the capping layer and the second organic layer and corresponding to the pixel electrode, and an inorganic layer on the second organic layer.

13 Claims, 7 Drawing Sheets

ORGANIC LIGHT-EMITTING DISPLAY APPARATUS

This application claims priority to Korean Patent Application No. 10-2015-0153804, filed on Nov. 3, 2015, and all the benefits accruing therefrom under 35 U.S.C. § 119, the content of which in its entirety is herein incorporated by reference.

BACKGROUND

1. Field

One or more exemplary embodiments relate to an organic light-emitting display apparatus and a method of manufacturing the same, and more particularly, to an organic light-emitting display apparatus having a simple structure which decreases a thickness thereof and minimizes damage to an organic light-emitting device, and a method of manufacturing the same.

2. Description of the Related Art

Among display apparatuses, an organic light-emitting display apparatus has various advantages such as a wide viewing angle, high contrast, and a high response rate, and thus has drawn much attention as a next-generation display apparatus.

In general, an organic light-emitting display apparatus includes a thin-film transistor and organic light-emitting devices on a substrate, in which the organic light-emitting devices emit light and operate. The organic light-emitting display apparatus may be used as not only a display unit in a small product such as a mobile phone but also a display unit in a large product such as a television.

The organic light-emitting display apparatus includes, as pixels or subpixels, organic light-emitting devices, each of which includes an intermediate layer including an emission layer, is interposed between a pixel electrode and an opposite electrode, and includes a thin-film transistor electrically connected to the organic light-emitting devices and other various elements. The organic light-emitting devices and the other various elements are vulnerable to impurities such as moisture, oxygen, etc. Thus, in order to display a high-quality image, it is important to block moisture and oxygen flowing from the outside to the organic light-emitting devices.

SUMMARY

In an organic light-emitting display apparatus and a method of manufacturing the same according to the related art, when an encapsulation layer is provided to block moisture and oxygen from flowing to an organic light-emitting device from the outside, the organic light-emitting display apparatus has a complicated structure and a thick thickness.

To address the problem and other problems, one or more exemplary embodiments include an organic light-emitting display apparatus and a method of manufacturing the same. However, the one or more of the exemplary embodiments are merely examples and thus the invention is not limited thereto.

Additional exemplary embodiments will be set forth in part in the description which follows and, in part, will be apparent from the description, or may be learned by practice of the presented exemplary embodiments.

According to one or more exemplary embodiments, an organic light-emitting display apparatus includes a substrate, a pixel electrode provided on the substrate, a capping layer provided on the pixel electrode, a second organic layer provided on the capping layer, a first organic layer interposed between the capping layer and the second organic layer and provided to correspond to the pixel electrode, and an inorganic layer provided on the second organic layer.

In one exemplary embodiment, the first organic layer and the second organic layer may directly contact each other in a surface contact manner.

In one exemplary embodiment, the capping layer and the first organic layer may directly contact each other in a surface contact manner.

In one exemplary embodiment, the capping layer and at least a portion of the second organic layer may directly contact each other in a surface contact manner.

In one exemplary embodiment, the organic light-emitting display apparatus may further include a pixel defining film including an opening for exposing a central portion of the pixel electrode and covering edges of the pixel electrode, and the first organic layer may be provided only in the opening.

In one exemplary embodiment, the organic light-emitting display apparatus may further include an opposite electrode provided on the pixel electrode to face the pixel electrode, and an intermediate layer including an emission layer interposed between the pixel electrode and the opposite electrode. The first organic layer may correspond to the intermediate layer.

In one exemplary embodiment, the first organic layer may include at least one of a vinyl-based resin and fluoro-based resin.

In one exemplary embodiment, the first organic layer may include at least one of a cured material of a first compound and a cured material of a second compound In one exemplary embodiment, the first compound may include a first main chain, and a first photo-curable functional group bound to both ends of the first main chain.

In one exemplary embodiment, the first main chain may include at least one of C6 to C18 hydrocarbon.

In one exemplary embodiment, the first photo-curable functional group may include a vinyl group.

In one exemplary embodiment, the second compound may include a second main chain, a second photo-curable functional group bound to one side of the second main chain, and a fluoro group.

In one exemplary embodiment, the second main chain may include at least one of C6 to C18 hydrocarbon.

In one exemplary embodiment, the second photo-curable functional group may include an acryl group.

According to one or more exemplary embodiments, a method of manufacturing an organic light-emitting display apparatus includes forming a pixel electrode on a substrate, forming a pixel defining film including an opening for exposing a central portion of the pixel electrode and covering edges of the pixel electrode, forming a capping layer on the pixel electrode, forming a first organic layer on the capping layer in the opening to correspond to the pixel electrode, forming a second organic layer on the first organic layer to cover the first organic layer, and forming an organic layer on the second organic layer.

In one exemplary embodiment, the capping layer and at least a portion of the second organic layer may directly contact each other in a surface contact manner.

In one exemplary embodiment, the first organic layer and the second organic layer may directly contact each other in a surface contact manner.

In one exemplary embodiment, the capping layer and the first organic layer may directly contact each other in a surface contact manner.

In one exemplary embodiment, the first organic layer may include at least one of a vinyl-based resin and fluoro-based resin.

In one exemplary embodiment, the first organic layer may be provided by inkjet printing.

Such general and particular exemplary embodiments may be accomplished according to a system, a method, a computer program, or any combinations thereof.

BRIEF DESCRIPTION OF THE DRAWINGS

These and/or other exemplary embodiments will become apparent and more readily appreciated from the following description of the exemplary embodiments, taken in conjunction with the accompanying drawings, in which.

DETAILED DESCRIPTION

The invention may be embodied in many different forms and accomplished in various embodiments. Thus, exemplary embodiments are illustrated in the drawings and described in detail herein. The effects and features of the invention and methods of accomplishing them will be apparent from the following embodiments in conjunction with the appended drawings. However, the invention is not limited to the following embodiments and changes may be made in these embodiments.

Hereinafter, exemplary embodiments will be described in detail with reference to the accompanying drawings. In the drawings, the same or corresponding elements are assigned the same reference numerals and are not redundantly described herein.

It will be understood that although the terms 'first', 'second', etc. may be used herein to describe various components, these components should not be limited by these terms. These components are only used to distinguish one component from another. As used herein, the singular forms 'a', 'an', and 'the' are intended to include the plural forms as well, unless the context clearly indicates otherwise.

It will be understood that the terms 'comprise' and/or 'comprising' used herein specify the presence of stated features or components, but do not preclude the presence or addition of one or more other features or components. It will be further understood that when a layer, region, or component is referred to as being 'on' another layer, region, or component, it can be directly or indirectly on the other layer, film, region, plate, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

As used herein, the term 'and/or' includes any and all combinations of one or more of the associated listed items. Expressions such as 'at least one of,' when preceding a list of elements, modify the entire list of elements and do not modify the individual elements of the list.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

When a certain embodiment may be implemented differently, a specific process order may be performed differently from the described order. In an exemplary embodiment, two consecutively described processes may be performed substantially at the same time or performed in an order opposite to the described order.

Figure 1:
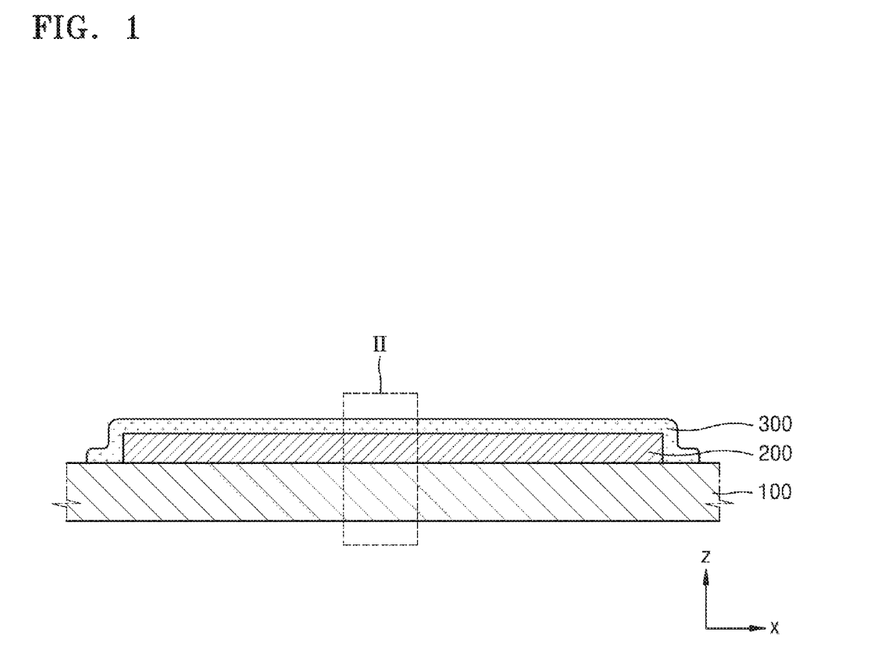
FIG. 1 is a schematic cross-sectional view of an exemplary embodiment of an organic light-emitting display apparatus according to the invention.
Figure 2:
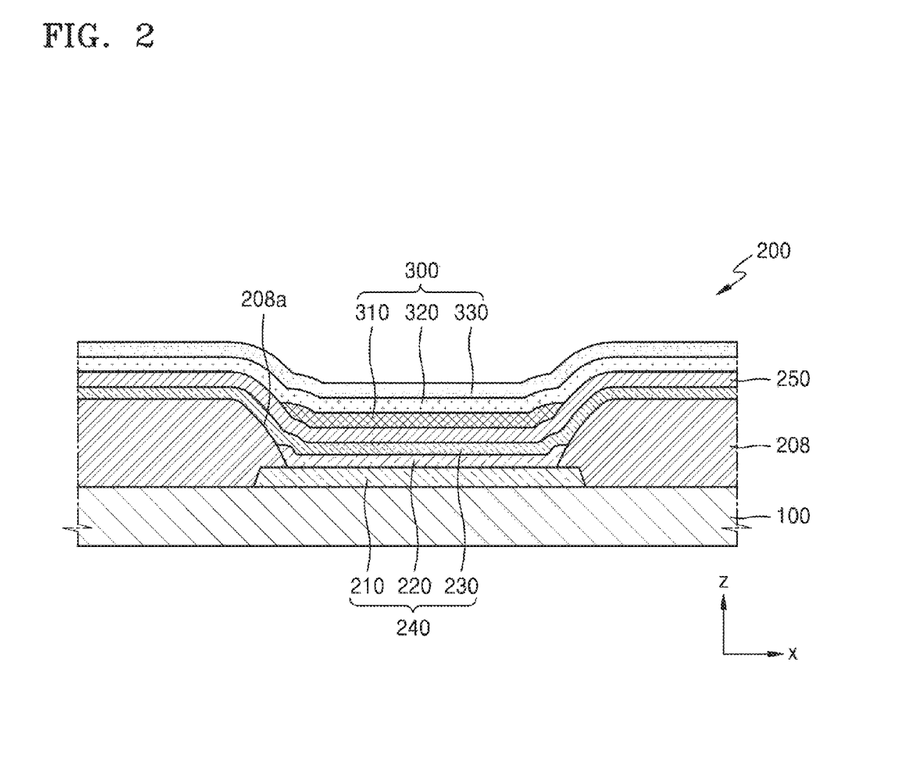
FIGS. 2 and 3 are enlarged cross-sectional views of a portion of FIG. 1, indicated by line II.
Figure 3:
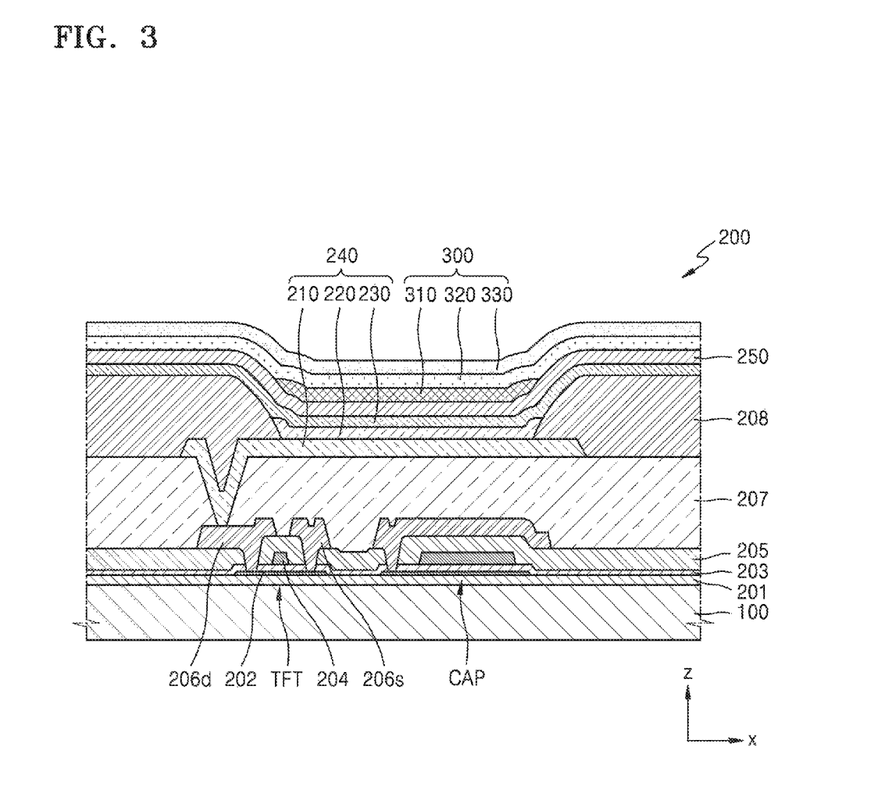

FIG. 1 is a schematic cross-sectional view of an organic light-emitting display apparatus according to an exemplary embodiment. FIGS. 2 and 3 are enlarged cross-sectional views of a portion of FIG. 1, indicated by line II.

Referring to FIG. 1, the organic light-emitting display apparatus according to an exemplary embodiment includes a substrate 100, a display unit 200 on the substrate 100, and a thin-film encapsulation layer 300 for sealing the display unit 200.

In an exemplary embodiment, the substrate 100 may include various materials, e.g., a glass material, a metal material, a plasmatic material, etc. In particular, in order to add a flexible feature to the organic light-emitting display apparatus according to an exemplary embodiment, the substrate 100 may include at least one material having high heat resistance, high durability, and a property of bending into a curved surface, including at least one of polyether sulfone ("PES"), polyacrylate ("PA"), polyetherimide ("PEI"), polyethylene napthalate ("PEN"), polyethylene terephthalate ("PET"), polyphenylene sulfide ("PPS"), polyarylate ("PAR"), polyimide ("PI"), polycarbonate ("PC"), cellulosetriacetate, cellulose acetate propionate ("CAP"), and poly(aryleneether sulfone).

The display unit 200 may be provided on the substrate 100. The display unit 200 may include a plurality of thin-film transistors and an organic light-emitting device 240 electrically connected to the plurality of thin-film transistors (refer to FIG. 2). In an exemplary embodiment, the display unit 200 may be a liquid crystal display unit or an organic light-emitting display unit, for example. The display unit 200 may include the organic light-emitting device 240 including a pixel electrode 210 which will be described below, and a capping layer 250 provided on the organic light-emitting device 240 (refer to FIG. 2).

The thin-film encapsulation layer 300 may be provided on the display unit 200. The thin-film encapsulation layer 300 may include at least one first organic layer 310, a second organic layer 320, and an inorganic layer 330. The thin-film encapsulation layer 300 may seal the display unit 200 such that thin-film encapsulation layer 300 covers the display unit 200 and ends of the thin-film encapsulation layer 300 contact the substrate 100. When the thin-film encapsulation layer 300 seals the display unit 200, the display unit 200 may be protected from impurities, such as oxygen, moisture, etc., from the outside.

In order to efficiently seal the display unit 200, the thin-film encapsulation layer 300 may have a multi-layer structure including a plurality of organic layers 310 and 320 (refer to FIG. 2) and a plurality of inorganic layers 330 (refer to FIG. 2). When the thin-film encapsulation layer 300 has the multi-layer structure described above, the whole thickness of the organic light-emitting display apparatus increases and the organic light-emitting display apparatus has a complicated structure which is difficult to manufacture. Thus, the organic light-emitting display apparatus according to an exemplary embodiment includes the thin-film encapsulation layer 300 including the first organic layer 310, the second organic layer 320, and the inorganic layer 330, which are sequentially provided on the display unit 200.

Referring to FIG. 2, the organic light-emitting display apparatus according to an exemplary embodiment includes the organic light-emitting device 240 on the substrate 100, the capping layer 250 on the organic light-emitting device 240, and the thin-film encapsulation layer 300 on the capping layer 250. The organic light-emitting device 240 may include the pixel electrode 210, an intermediate layer 220 including an emission layer ("EML"), and an opposite electrode 230. The thin-film encapsulation layer 300 may include the first organic layer 310, the second organic layer 320, and the inorganic layer 330.

The organic light-emitting device 240 may include the pixel electrode 210, the intermediate layer 220 including the EML, and the opposite electrode 230.

As illustrated in FIG. 2, the pixel electrode 210 may be provided on the substrate 100. In exemplary embodiments, the providing of the pixel electrode 210 may be provided directly on the substrate 100, or various layers are provided on the substrate 100 and the pixel electrode 210 is provided on the various layers. In an exemplary embodiment, a thin-film transistor may be provided on the substrate 100, a planarization film may cover the thin-film transistor, and the pixel electrode 210 may be provided on the planarization film, for example. For convenience of explanation, FIG. 2 illustrates the pixel electrode 210 as being located directly on the substrate 100. This also applies to the following description.

The pixel electrode 210 may be a transparent or semi-transparent electrode or a reflective electrode. When the pixel electrode 210 is a transparent or semi-transparent electrode, the pixel electrode 210 may include, for example, indium tin oxide ("ITO"), indium zinc oxide ("IZO"), Zinc oxide (ZnO), $In_2O_3$, indium gallium oxide ("IGO"), or aluminum-doped zinc oxide ("AZO"). When the pixel electrode 210 is a reflective electrode, the pixel electrode 210 may include a reflective film including Ag, Mg, Al, Pt, Pd, Au, Ni, Nd, Ir, Cr, or any combinations thereof, and a layer including ITO, IZO, ZnO, $In_2O_3$, IGO, or AZO. Exemplary embodiments are not, however, limited thereto and the pixel electrode 210 may be embodied in many different forms. In an exemplary embodiment, the pixel electrode 210 may include other various materials and be a single layer or a multi-layer structure, for example.

A pixel defining film 208 in which an opening 208a exposing a central portion of the pixel electrode 210 is defined and which covers edges of the pixel electrode 210 may be further provided on the pixel electrode 210. Although FIG. 2 illustrates that the pixel defining film 208 is provided directly on the substrate 100 to cover the edges of the pixel electrode 210, exemplary embodiments are not limited thereto. Similar to the pixel electrode 210, the pixel defining film 208 may be provided directly on the substrate 100 or various layers may be provided on the substrate 100 and the pixel defining film 208 may be located on the various layers. The pixel defining film 208 may define a pixel region through the opening 208a exposing the central portion of the pixel electrode 210.

The intermediate layer 220 may be provided on the central portion of the pixel electrode 210, i.e., the pixel region defined by the pixel defining film 208. The intermediate layer 220 may include the EML that emits light from an electrical signal. In addition to the EML, the intermediate layer 220 may include a stack structure including at least one among a hole injection layer ("HIL") and a hole transport layer ("HTL") between the EML and the pixel electrode 210, and an electron transport layer (ETL) and an electron injection layer ("EIL") between the EML and the opposite electrode 230, etc., for example. The intermediate layer 220 is not, however, limited thereto and may have various structures.

The intermediate layer 220 may include a low molecular weight organic material or a high molecular weight organic material.

When the intermediate layer 220 includes a low molecular weight organic material, an HTL, an HIL, an ETL, an EIL, and the like may be stacked around the emission layer EML. In addition, other various layers may be stacked when necessary. In this case, various organic materials such as copper phthalocyanine (CuPc), N'-Di(naphthalene-1-yl)-N, N'-diphenyl-benzidine ("NPB"), tris-8-hydroxyquinoline aluminum (Alq3), etc. are applicable.

When the intermediate layer 220 includes a high molecular weight organic material, not only the intermediate layer 220 but also an HTL may be included. In an exemplary embodiment, the HTL may include at least one of poly-(2, 4)-ethylene-dihydroxy thiophene ("PEDOT"), polyaniline ("PANT"), etc. In this case, organic materials such as a poly-phenylenevinylene ("PPV")-based polymeric organic material, a polyfluorene-based polymeric organic material, etc., are available. In addition, an inorganic material may be provided between the intermediate layer 220, the pixel electrode 210, and the opposite electrode 230.

The HTL, the HIL, the ETL, and the EIL may be unitary over an entire surface of the substrate 100, and only the EML may be sedately provided for each pixel by inkjet printing, for example.

The opposite electrode 230, which covers the intermediate layer 220 including the EML and faces the pixel electrode 210, may be provided on the whole surface of the substrate 100. The opposite electrode 230 may be a transparent or semi-transparent electrode or a reflective electrode, When the opposite electrode 230 is a transparent or semi-transparent electrode, the opposite electrode 230 may include a layer including a metal having a low work function, e.g., Li, Ca, LiF/Ca, LiF/Al, Al, Ag, Mg, or any combinations thereof, and a transparent or semi-transparent conductive layer including ITO, IZO, ZnO, or In$_2$O$_3$. When the opposite electrode 230 is a reflective electrode, the opposite electrode 230 may include a layer including Li, Ca, LiF/Ca, LiF/Al, Al, Ag, Mg, or any combinations thereof. The structure and materials of the opposite electrode 230 are not, however, limited thereto and may be embodied in many different forms.

The capping layer 250 may be further provided on the opposite electrode 230. Similar to the opposite electrode 230, the capping layer 250 may be provided on all the surfaces of the substrate 100 and include an organic material. In an exemplary embodiment, the organic material of the capping layer 250 may be a triphenylamine-based compound, for example. In an exemplary embodiment, the organic material of the capping layer 250 may include, for example, at least one of m-MTDATA, TDATA, 2-TNATA, NPB, TPD, β-NPB, Spiro-TPD, spiro-NPB, α-NPB, TAPC, HMTPD, 4,4',4''-tris(N-carbazolyl)triphenylamine ("TCTA"), polyaniline/dodecylbenzenesulfonic acid ("Pani/DBSA"), poly(3,4-ethylenedioxythiophene)/poly(4-styrenesulfonate) ("PEDOT/PSS"), polyaniline/camphor sulfonicacid ("Pani/CSA"), and polyaniline/poly(4-styrenesulfonate) ("PANI/PSS"), but exemplary embodiments are not limited thereto. The capping layer 250 may improve a rate of extracting light emitted from the organic light-emitting device 240 to increase the optical efficiency of the organic light-emitting display apparatus.

The first organic layer 310 may be provided on the capping layer 250. The capping layer 250 and the first organic layer 310 may direct contact each other in a surface contact manner. The first organic layer 310 may correspond to the pixel electrode 210. The providing of the first organic layer 310 to correspond to the pixel electrode 210 may be understood that although FIG. 2 illustrates only one pixel electrode 210, the display unit 200 includes a plurality of pixel electrodes (not shown) spaced apart from each other and a plurality of first organic layers 310 corresponds to the plurality of pixel electrodes in this case. The first organic layer 310 may correspond to the pixel region defined by the pixel defining film 208, i.e., the intermediate layer 220 including the EML on the central portion of the pixel electrode 210. In this case, as described above, the intermediate layer 220 may be also understood as the EML provided for each pixel by inkjet printing rather than the HTL, the HIL, the ETL, the EIL, etc. provided on all the surfaces of the substrate 100. In other words, the first organic layer 310 may be provided only in the opening 208a of the pixel defining film 208.

In an exemplary embodiment, the first organic layer 310 may include at least one of vinyl-based resin and fluoro-based resin.

In detail, the first organic layer 310 may include at least one of a cured material of a first compound and a cured material of a second compound. The first compound may include a first main chain and a first photo-curable functional group bound to the first main chain. In this case, the first photo-curable functional group may be bound to both ends of the first main chain. Thus, the first compound may include two or more first photo-curable functional groups. The first photo-curable functional group may include a vinyl group. As described above, the vinyl group may be bound to both ends of the first main chain. In an exemplary embodiment, the first main chain may include at least one of C6 to C18 hydrocarbon, for example.

The second compound may include a second main chain and a second photo-curable functional group bound to the second main chain. The second compound may include a second main chain and a second photo-curable functional group bound to the second main chain. In this case, the second photo-curable functional group may be bound to one side of the second main chain. The second photo-curable functional group may include an acryl group but is not limited thereto and may include any material having a photo-curing property. The second main chain may include at least one of C6 to C18 hydrocarbon, for example.

The second organic layer 320 may be provided on the first organic layer 310. The first organic layer 310 and the second organic layer 320 may directly contact each other in the surface contact manner. Similar to the capping layer 250, the second organic layer 320 may be provided on all the surfaces of the substrate 100. Thus, the first organic layer 310 may be disposed between the second organic layer 320 and the capping layer 250. However, in this case, since the first organic layer 310 is provided only in the opening 208a of the pixel defining film 208 to correspond to the pixel electrode 210 as described above, the capping layer 250 may directly contact at least a portion of the second organic layer 320 in the surface contact manner although the first organic layer 310 is between the second organic layer 320 and the capping layer 250.

In an exemplary embodiment, the second organic layer 320 may include, for example, at least one of silicon-based resin, acryl-based resin, methacryl-based resin, polyisoprene, vinyl-based resin, epoxy-based resin, urethane-based resin, cellulose-based resin, and perylene-based resin. In detail, examples of the acryl-based resin include butyl acrylate, ethylhexyl acrylate, etc. In detail, examples of the methacryl-based resin include propylene glycol methacrylate, tetra hydroperfuryl methacrylate, etc. Examples of the vinyl-based resin include vinyl acetate, N-vinyl pyrrolidone, etc. Examples of the epoxy-based resin include cycloaliphatic epoxide, epoxy acrylate, vinyl epoxy-based resin, etc. Examples of the urethane-based resin include urethane acrylate, etc. Examples of the cellulose-based resin include cellulose nitrate, etc. However, exemplary embodiments are not limited thereto.

The inorganic layer 330 may be provided on the second organic layer 320. The inorganic layer 330 may be provided directly on the second organic layer 320. Similar to the second organic layer 320, the inorganic layer 330 may be provided on all the surfaces of the substrate 100. In an exemplary embodiment, the inorganic layer 330 may include, for example, at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

FIG. 3 illustrates a display unit 200 including a thin-film transistor according to another embodiment. In the display unit 200, a pixel electrode 210 may be provided directly on a substrate 100 as described above but various layers including a thin-film transistor may be provided on the substrate 100 and the pixel electrode 210 may be provided on the various layers as illustrated in FIG. 3. The structure of the display unit 200 including the thin-film transistor will be described below.

First, a buffer layer 201 including a silicon oxide or a silicon nitride may be provided on the substrate 100 to planarize a surface of the substrate 100 or to prevent an impurity or the like from penetrating a semiconductor layer 202 of a thin-film transistor TFT. The semiconductor layer 202 may be provided on the buffer layer 201.

A gate electrode 204 is provided above the semiconductor layer 202. A source electrode 206s and a drain electrode 206d are electrically connected to each other according to a signal supplied to the gate electrode 204. In an exemplary embodiment, the gate electrode 204 may be provided in a single layer or a multi-layer structure including, for example, at least one among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), taking account into an adhesive property between the gate electrode 204 and a layer adjacent thereto, a surface smoothness of a surface of a layer to be stacked thereon, processability, etc.

In this case, in order to secure an insulating property between the semiconductor layer 202 and the gate electrode 204, a gate insulating film 203 including a silicon oxide and/or a silicon nitride may be disposed between the semiconductor layer 202 and the gate electrode 204.

An interlayer insulating film 205 may be provided on the gate electrode 204. The interlayer insulating film 205 may be provided in a single layer or a multi-layer structure including a silicon oxide, a silicon nitride, etc., for example.

The source electrode 206s and the drain electrode 206d are provided on the interlayer insulating film 205. The source electrode 206s and the drain electrode 206d are electrically connected to the semiconductor layer 202 via a hole defined in the interlayer insulating film 205 and the gate insulating film 203. In an exemplary embodiment, the source electrode 206s and the drain electrode 206d may be provided in a single layer or a multi-layer structure including, for example, at least one material among aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), taking account into a conductive property, etc.

Although not shown, a protective film (not shown) may cover the thin-film transistor TFT so as to protect the thin-film transistor TFT having the structure described above. In an exemplary embodiment, the protective film may include an inorganic material, e.g., a silicon oxide, a silicon nitride, a silicon oxynitride, etc.

A planarization film 207 may be provided on the substrate 100. The planarization film 207 substantially planarizes a top surface of the thin-film transistor TFT when an organic light-emitting device 240 is provided above the thin-film transistor TFT, and protects the thin-film transistor TFT and various elements. In an exemplary embodiment, the planarization film 207 may include, for example, at least one of an acryl-based organic material, benzocyclobutene ("BCB"), etc. In this case, the buffer layer 201, the gate insulating film 203, the interlayer insulating film 205, and the planarization film 207 may be provided on an entire surface of the substrate 100.

A pixel defining film 208 may be provided above the thin-film transistor TFT. The pixel defining film 208 may be provided on the planarization film 207 and an opening 208a exposing a central portion of the pixel electrode 210 may be defined in the pixel defining film 208. The pixel defining film 208 defines a pixel region through the opening 208a.

The pixel defining film 208 may be, for example, an organic insulating film. Examples of the organic insulating film may include a acryl-based polymer such as polymethyl methacrylate ("PMMA"), polystyrene ("PS"), a polymer derivative such as a phenol group, an imide-based polymer, an aryl ether-based polymer, an amide-based polymer, a fluoro-based polymer, a p-xylene-based polymer, a vinyl alcohol-based polymer, and any combinations thereof.

The organic light-emitting device 240 may be provided on the pixel defining film 208. The structures of the organic light-emitting device 240, the capping layer 250, and the thin-film encapsulation layer 300 are as described above with reference to FIG. 2 and are thus not redundantly described here.

In an organic light-emitting display apparatus according to an exemplary embodiment, the thin-film encapsulation layer 300 may be simplified to a structure including the first organic layer 310, the second organic layer 320, and the inorganic layer 330. In this case, in order to minimize damage to the organic light-emitting device 240, caused by a reaction between the capping layer 250 including an organic material and the second organic layer 320, the first organic layer 310 including a vinyl group or a fluoro group and having low reactivity with the capping layer 250 is disposed between the capping layer 250 and the second organic layer 320 to correspond to the organic light-emitting device 240.

Although the organic light-emitting display apparatus has been mainly described above, exemplary embodiments are not limited thereto. In an exemplary embodiment, a method of manufacturing an organic light-emitting display apparatus is also within the scope of invention, for example.

FIGS. 4 to 7 are schematic cross-sectional views illustrating a process of manufacturing an organic light-emitting display apparatus according to an exemplary embodiment.

Figure 4:
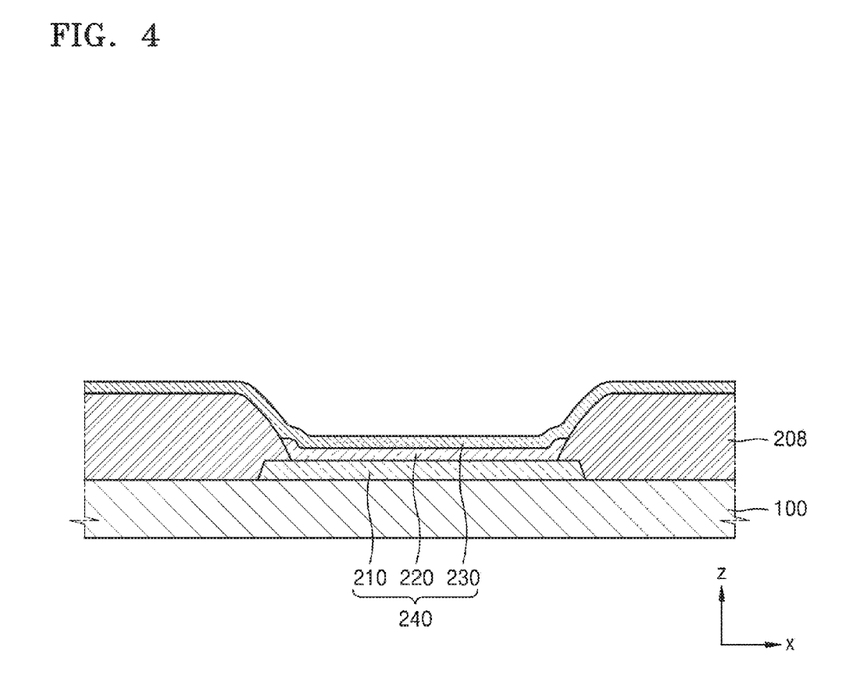
FIGS. 4 to 7 are schematic cross-sectional views illustrating an exemplary embodiment of a process of manufacturing an organic light-emitting display apparatus according to the invention.

Referring to FIG. 4, first, a pixel electrode 210 may be disposed on a substrate 100. The forming of the pixel electrode 210 on the substrate 100 includes forming the pixel electrode 210 directly on the substrate 100 or forming various layers on the substrate 100 and forming the pixel electrode 210 on the various layers. In an exemplary embodiment, a thin-film transistor may be disposed on the substrate 100, a planarization film may cover the thin-film transistor, and the pixel electrode 210 may be disposed on the planarization film, for example. For convenience of explanation, the pixel electrode 210 is illustrated as being directly on the substrate 100. This also applies to the following description.

The pixel electrode 210 may be a transparent or semi-transparent electrode or a reflective electrode. When the pixel electrode 210 is the transparent or semi-transparent electrode, the pixel electrode 210 may include, for example, ITO, IZO, ZnO, $In_2O_3$, IGO, or AZO. When the pixel electrode 210 is the reflective electrode, the pixel electrode 210 may include a reflective film including Ag, Mg, Al, Pt, Pd, Au, Ni, Nd, Ir, Cr, or any combinations thereof and a layer including ITO, IZO, ZnO, $In_2O_3$, IGO, or AZO. Exemplary embodiments are not, however, limited thereto and the pixel electrode 210 may be embodied in many different forms. In an exemplary embodiment, the pixel electrode 210 may include other various materials and be a single layer or a multi-layer structure, for example.

Thereafter, a pixel defining film 208 in which an opening 208a exposing a central portion of the pixel electrode 210 is defined and which covers edges of the pixel electrode 210 may be disposed on the pixel electrode 210. Although FIG. 4 illustrates that the pixel defining film 208 is disposed directly on the substrate 100 to cover the edges of the pixel electrode 210, exemplary embodiments are not limited thereto. Similar to the pixel electrode 210, the pixel defining film 208 may be disposed directly on the substrate 100 or various layers may be disposed on the substrate 100 and the pixel defining film 208 may be disposed on the various layers. The pixel defining film 208 may define a pixel region through the opening 208*a* exposing the central portion of the pixel electrode 210.

Then, an intermediate layer 220 may be disposed on the central portion of the pixel electrode 210, i.e., the pixel region defined by the pixel defining film 208. The intermediate layer 220 includes an EML which emits light from an electrical signal. In addition to the EML, the intermediate layer 220 may be provided in a single layer or a multi-layer structure by stacking at least one among an HIL and an HTL between the EML and the pixel electrode 210, an ETL and an EIL between the EML and the opposite electrode 230, etc. The intermediate layer 220 is not, however, limited thereto and may have any of other various structures.

In this case, the HTL, the HIL, the ETL, and the EIL may be unitary over an entire surface of the substrate 100 and only the EML may be separately provided for each pixel by inkjet printing.

An opposite electrode 230 covering the intermediate layer 220 including the EML and facing the pixel electrode 210 may be provided on all the surfaces of the substrate 100. The opposite electrode 230 may be a transparent or semi-transparent electrode or a reflective electrode.

In an exemplary embodiment, when the opposite electrode 230 is a transparent or semi-transparent electrode, the opposite electrode 230 may include a layer including a metal having a low work function, i.e., Li, Ca, LiF/Ca, LiF/Al, Al, Ag, Mg, or any combinations thereof and a transparent or semi-transparent conductive layer including ITO, IZO, ZnO, In$_2$O$_3$, or the like. When the opposite electrode 230 is the reflective electrode, the opposite electrode 230 may include a layer including Li, Ca, LiF/Ca, LiF/Al, Al, Ag, Mg, or any combinations thereof. However, the structure and material of the opposite electrode 230 are not limited thereto and the opposite electrode 230 may be embodied in many different forms.

Figure 5:
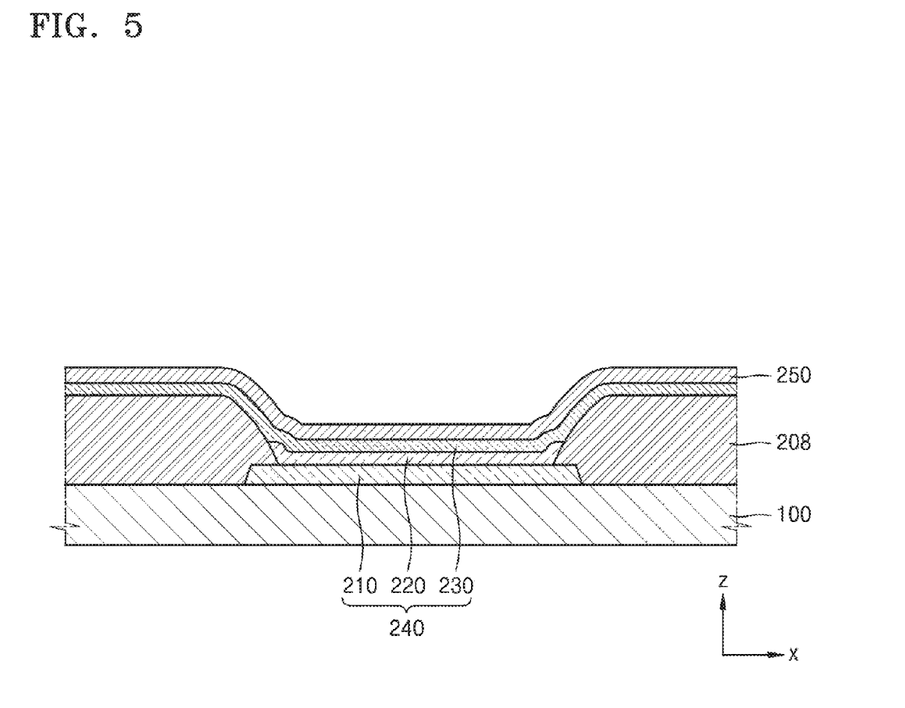

Thereafter, referring to FIG. 5, a capping layer 250 may be disposed on the opposite electrode 230. Similar to the opposite electrode 230, the capping layer 250 may be disposed on all the surfaces of the substrate 100 and include an organic material. In an exemplary embodiment, the organic material of the capping layer 250 may be a triphenylamine-based compound. In addition, the organic material of the capping layer 250 may include, for example, m-MTDATA, TDATA, 2-TNATA, NPB, TPD, β-NPB, Spiro-TPD, spiro-NPB, α-NPB, TAPC, HMTPD, TCTA, Pani/DBSA, PEDOT/PSS, Pani/CSA, PANI/PSS, or any combinations thereof, but exemplary embodiments are not limited thereto. The capping layer 250 may improve a rate of extracting light emitted from the organic light-emitting device 240 to increase the optical efficiency of the organic light-emitting display apparatus.

Figure 6:
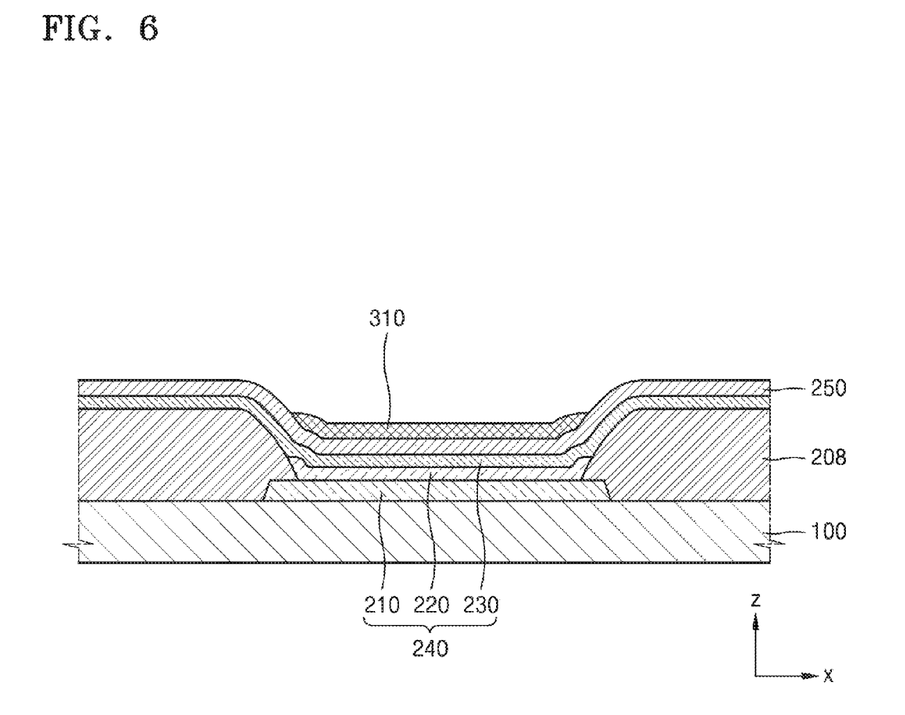

Then, referring to FIG. 6, a first organic layer 310 may be disposed on the capping layer 250. The capping layer 250 and the first organic layer 310 may directly contact each other in the surface contact manner. The first organic layer 310 may correspond to the pixel electrode 210. The forming of the first organic layer 310 to correspond to the pixel electrode 210 may include forming a plurality of pixel electrodes (not shown) spaced apart from each other and a plurality of first organic layers 310 respectively corresponding to the plurality of pixel electrodes although FIG. 6 illustrates only one pixel electrode 210. The first organic layer 310 may correspond to the pixel region defined by the pixel defining film 208, i.e., the intermediate layer 220 including the EML located on the central portion of the pixel electrode 210. In this case, as described above, the intermediate layer 220 may be the EML provided for each pixel by inkjet printing rather than the HTL, the HIL, the ETL, the EIL, etc., disposed on all the surfaces of the substrate 100. In other words, the first organic layer 310 may be located only in the opening 208*a* of the pixel defining film 208.

In an exemplary embodiment, the first organic layer 310 may include at least one of a vinyl-based resin and a fluoro-based resin, for example.

In detail, the first organic layer 310 may include at least one of a cured material of a first compound and a cured material of a second compound. The first compound may include a first main chain and a first photo-curable functional group bound to the first main chain. In this case, the first photo-curable functional group may be bound to both ends of the first main chain. Thus, the first compound may include two or more first photo-curable functional groups. In an exemplary embodiment, the first photo-curable functional group may include a vinyl group, for example. As described above, the vinyl group may be bound to both ends of the first main chain. In an exemplary embodiment, the first main chain may include at least one of C6 to C18 hydrocarbon, for example.

The second compound may include a second main chain and a second photo-curable functional group bound to the second main chain. The second compound may include a second main chain and a second photo-curable functional group bound to the second main chain. In this case, the second photo-curable functional group may be bound to one side of the second main chain. The second photo-curable functional group may include an acryl group but is not limited thereto and may include any material having a photo-curing property. In an exemplary embodiment, the second main chain may include at least one of C6 to C18 hydrocarbon, for example.

Figure 7:
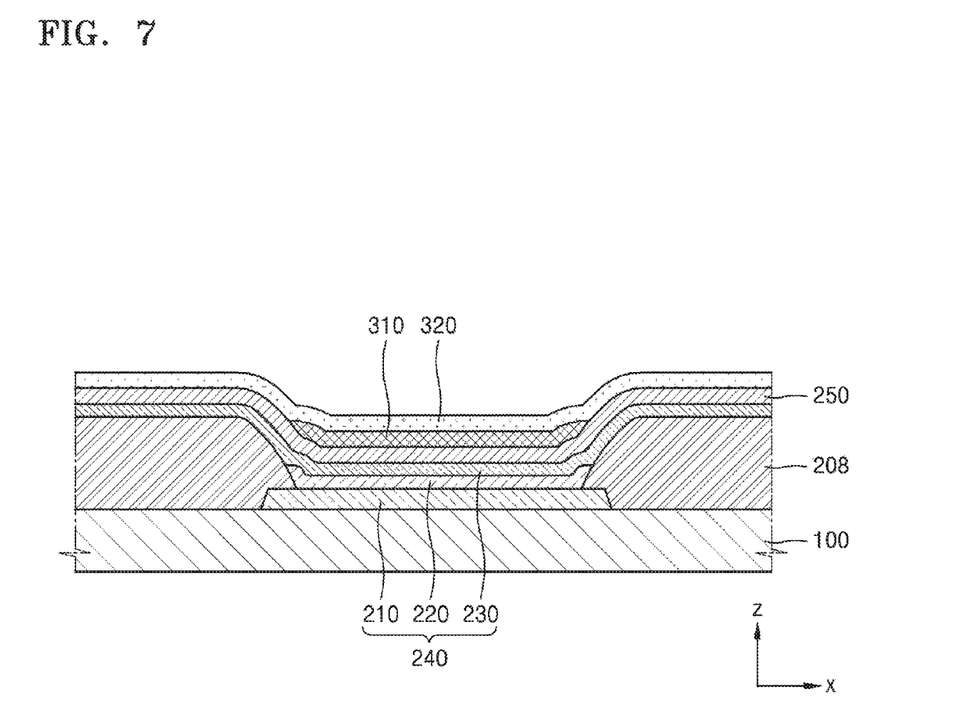

Then, referring to FIG. 7, a second organic layer 320 may be disposed on the first organic layer 310. The first organic layer 310 and the second organic layer 320 may directly contact each other in the surface contact manner. Similar to the capping layer 250, the second organic layer 320 may be disposed on an entire surface of the substrate 100. However, in this case, since the first organic layer 310 is provided only in the opening 208*a* of the pixel defining film 208 to correspond to the pixel electrode 210 as described above, the capping layer 250 may directly contact at least a portion of the second organic layer 320 in the surface contact manner although the first organic layer 310 is between the second organic layer 320 and the capping layer 250.

In an exemplary embodiment, the second organic layer 320 may include, for example, at least one of silicon-based resin, acryl-based resin, methacryl-based resin, polyisoprene, vinyl-based resin, epoxy-based resin, urethane-based resin, cellulose-based resin, and perylene-based resin. In detail, examples of the acryl-based resin include butyl acrylate, ethylhexyl acrylate, etc. Examples of the methacryl-based resin include propylene glycol methacrylate, tetra hydroperfuryl methacrylate, etc. Examples of the vinyl-based resin include vinyl acetate, N-vinyl pyrrolidone, etc. Examples of the epoxy-based resin include cycloaliphatic epoxide, epoxy acrylate, vinyl epoxy-based resin, etc. Examples of the urethane-based resin include urethane acrylate, etc. Examples of the cellulose-based resin include cellulose nitrate, etc. However, exemplary embodiments are not limited thereto.

Thereafter, referring back to FIG. 2, an inorganic layer 330 may be disposed on the second organic layer 320. The inorganic layer 330 may be disposed directly on the second organic layer 320. Similar to the second organic layer 320, the inorganic layer 330 may be disposed on all the surfaces of the substrate 100. In an exemplary embodiment, the inorganic layer 330 may include, for example, at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

In an organic light-emitting display apparatus provided according to a method of manufacturing an organic light-emitting display apparatus according to an exemplary embodiment, a thin-film encapsulation layer 300 may be simplified to a structure including the first organic layer 310, the second organic layer 320, and the inorganic layer 330. In addition, in this case, in order to minimize damage to the organic light-emitting device 240, caused by a reaction between the capping layer 250 including an organic material and the second organic layer 320, the first organic layer 310 including a vinyl group or a fluoro group and having low reactivity with the capping layer 250 may be disposed between the capping layer 250 and the second organic layer 320 to correspond to the organic light-emitting device 240.

As described above, according to an exemplary embodiment, an organic light-emitting display apparatus having a simple structure to decrease a thickness thereof and minimizing damage to an organic light-emitting device, and a method of manufacturing the same may be realized. However, the scope of the invention is not limited by the effects.

It should be understood that the exemplary embodiments described herein should be considered in a descriptive sense only and not for purposes of limitation. Descriptions of features or exemplary embodiments within each embodiment should typically be considered as available for other similar features or exemplary embodiments in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An organic light-emitting display apparatus comprising:
    a substrate;
    a pixel electrode on the substrate;
    a capping layer on the pixel electrode;
    a second organic layer on the capping layer;
    a first organic layer between the capping layer and the second organic layer and corresponding to the pixel electrode; and
    an inorganic layer on the second organic layer,
    wherein the capping layer and at least a portion of the second organic layer directly contact each other.

2. The organic light-emitting display apparatus of claim 1, wherein the first organic layer and the second organic layer directly contact each other in a surface contact manner.

3. The organic light-emitting display apparatus of claim 1, wherein the capping layer and the first organic layer directly contact each other in a surface contact manner.

4. The organic light-emitting display apparatus of claim 1, further comprising a pixel defining film in which an opening exposing a central portion of the pixel electrode and covering edges of the pixel electrode is defined,
    wherein the first organic layer is provided only in the opening.

5. The organic light-emitting display apparatus of claim 1, further comprising:
    an opposite electrode on the pixel electrode and faces the pixel electrode; and
    an intermediate layer between the pixel electrode and the opposite electrode, the intermediate layer including an emission layer,
    wherein the first organic layer corresponds to the intermediate layer.

6. The organic light-emitting display apparatus of claim 1, wherein the first organic layer comprises at least one of a vinyl-based resin and fluoro-based resin.

7. An organic light-emitting display apparatus comprising:
    a substrate;
    a pixel electrode on the substrate;
    a capping layer on the pixel electrode;
    a second organic layer on the capping layer;
    a first organic layer between the capping layer and the second organic layer and corresponding to the pixel electrode; and
    an inorganic layer on the second organic layer,
    wherein the first organic layer comprises at least one of a cured material of a first compound and a cured material of a second compound.

8. The organic light-emitting display apparatus of claim 7, wherein the first compound comprises:
    a first main chain; and
    a first photo-curable functional group bound to both ends of the first main chain.

9. The organic light-emitting display apparatus of claim 8, wherein the first main chain comprises at least one of C6 to C18 hydrocarbon.

10. The organic light-emitting display apparatus of claim 8, wherein the first photo-curable functional group comprises a vinyl group.

11. The organic light-emitting display apparatus of claim 7, wherein the second compound comprises:
    a second main chain;
    a second photo-curable functional group bound to one side of the second main chain; and
    a fluoro group.

12. The organic light-emitting display apparatus of claim 11, wherein the second main chain comprises at least one of C6 to C18 hydrocarbon.

13. The organic light-emitting display apparatus of claim 11, wherein the second photo-curable functional group comprises an acryl group.

* * * * *